US011402057B1

(12) United States Patent
Ho

(10) Patent No.: US 11,402,057 B1
(45) Date of Patent: Aug. 2, 2022

(54) SECURELY MOUNTABLE/DISMOUNTABLE ELECTRONIC EQUIPMENT SUPPORT STAND

(71) Applicant: OXTI CORPORATION, New Taipei (TW)

(72) Inventor: Chih-Feng Ho, New Taipei (TW)

(73) Assignee: OXTI CORPORATION, New Taipei (TW)

( * ) Notice: Subject to any disclaimer, the term of this patent is extended or adjusted under 35 U.S.C. 154(b) by 0 days.

(21) Appl. No.: 17/206,086

(22) Filed: Mar. 18, 2021

(51) Int. Cl.
*F16M 11/20* (2006.01)
*H05K 5/02* (2006.01)
*F16M 11/38* (2006.01)

(52) U.S. Cl.
CPC ......... *F16M 11/2014* (2013.01); *F16M 11/38* (2013.01); *H05K 5/0234* (2013.01)

(58) Field of Classification Search
CPC combination set(s) only.
See application file for complete search history.

(56) References Cited

U.S. PATENT DOCUMENTS 4,928,914 A * 5/1990 Snodell ................ F16M 13/027 248/323
5,102,081 A * 4/1992 Barchus ................ F16M 11/14 248/371
6,042,068 A * 3/2000 Tcherny ................ F16M 11/08 248/221.11
7,503,536 B2 * 3/2009 Friederich ............ F16M 11/043 248/343
8,246,174 B2 * 8/2012 Hsieh .................. G03B 21/145 353/101
8,276,867 B2 * 10/2012 Hung ................ F16M 11/2078 248/323
8,454,174 B2 * 6/2013 Nakano .................. F16M 13/02 248/176.1
8,573,551 B2 * 11/2013 Hung .................. G03B 21/145 248/323
10,509,302 B2 * 12/2019 Schuh .................... F16M 11/24
10,684,534 B2 * 6/2020 Richins ................ F16M 13/022
2007/0034764 A1 * 2/2007 Dittmer ................ F16M 11/041 348/E5.145
2008/0061200 A1 * 3/2008 Bouissiere ........... F16M 11/041 248/343

(Continued)

*Primary Examiner* — Monica E Millner
(74) *Attorney, Agent, or Firm* — Leong C. Lei

(57) ABSTRACT

A securely mountable/dismountable electronic equipment support stand includes electronic equipment and a support stand. The electronic equipment is provided with a first arc groove. The support stand includes a bottom base, a top base, and a supporting portion. The top base is provided with two first pegs corresponding to the first arc groove. The bottom base is formed with a receiving space corresponding to the supporting portion. The supporting portion has two ends respectively pivoted to and arranged between the bottom base and the top base. An adaptor board is further disposed at one side of the support stand. The collaborative combination between the first arc groove and the two first pegs allow the electronic equipment to be fixed to the top base of the support stand but still allowing the electronic equipment to rotate for adjustment of the electronic equipment on the support stand to orient toward different directions.

4 Claims, 7 Drawing Sheets

1
122
125
123
112
121

(56) References Cited

U.S. PATENT DOCUMENTS

| | | | | |
|---|---|---|---|---|
| 2009/0108150 | A1* | 4/2009 | Dozier | F16M 11/12<br>248/324 |
| 2009/0316118 | A1* | 12/2009 | Dittmer | F16M 11/043<br>353/119 |
| 2011/0089300 | A1* | 4/2011 | Walters | F16M 11/2092<br>248/274.1 |
| 2014/0077053 | A1* | 3/2014 | Chang | F16M 11/2085<br>248/346.06 |
| 2021/0405685 | A1* | 12/2021 | Hobbs | H05K 5/0234 |

* cited by examiner

SECURELY MOUNTABLE/DISMOUNTABLE ELECTRONIC EQUIPMENT SUPPORT STAND

TECHNICAL FIELD OF THE INVENTION

The present invention relates to a support stand, and more particularly to a support stand for electronic equipment.

DESCRIPTION OF THE PRIOR ART

A known electronic device, such as a projector, is attachable to a support stand to increase the height thereof for facilitating projection of images. An example is Taiwan Utility Model M507480, which discloses a projection system that includes, as shown in FIG. 1 of the document, a lower moving mechanism that is provided on a support base to be operatively cooperative with an upper moving mechanism, such that a relative movement between the upper moving mechanism and the lower moving mechanism causes a change in relative position of a machine body with respect to the support base for adjusting an elevation angle thereof for image projection. Such a known device is limited in functionality as it allows only adjustment of the elevation angle of projection.

Further, Taiwan Patent No. 501743 discloses a projector elevating/lowering adjustment device, which, as shown in FIG. 3 thereof, generally comprises components including a main body, an adjustment button, and a support frame. Pressing down the adjustment button that is provided, in a protruding form, on a front side surface of the main body would cause disengagement from or engagement with a positioning tooth of the support frame, so that the support frame that is located inside a slide sleeve is allowed to freely move upwards/downward with the slide sleeve as being acted upon by an elastic element, in order to adjust an inclination condition of the projector. Such a known device is limited in functionality as it allows only adjustment of inclination.

The prior art electronic equipment of the above two projection devices provide functionality for only adjusting elevation angle or inclination and is only usable as being positioned on a desktop. Further, the prior art electronic equipment of the above two projection devices allows only for projecting an image or playing an image in one single direction or a fixed direction, so that in case that the projection direction has to be change in response to a change of the operation environment, it is necessary to move the main body of the electronic equipment in order to change the projection direction. This is very inconvenient.

SUMMARY OF THE INVENTION

To overcome the above problem, the present invention provides a securely mountable/dismountable electronic equipment support stand, which comprises: electronic equipment and a support stand. The electronic equipment is provided with a first arc groove. The support stand comprises a bottom base, a top base, and a supporting portion. The top base is provided with two first pegs corresponding to the first arc groove. The bottom base is formed with a receiving space corresponding to the supporting portion. The supporting portion has two ends respectively pivoted to and arranged between the bottom base and the top base.

Preferably, the arc groove comprises a sliding zone and a retaining zone, and the sliding zone has an inside diameter that is greater than an inside diameter of the retaining zone.

Preferably, the first arc groove comprises a first groove segment and a second groove segment, and the first groove segment and the second groove segment are provided therebetween with a spacing distance.

Preferably, the bottom base of the support stand is provided with a second arc groove.

Preferably, an adaptor board is disposed at one side of the support stand, and the adaptor board is provided with two second pegs.

The securely mountable/dismountable electronic equipment support stand according to the present invention makes use of the collaborative combination between the first arc groove and the two first pegs to securely retain and fix the electronic equipment to the top base of the support stand, but still allowing the electronic equipment to rotate so that the electronic equipment demonstrates a capability of adjustment for various orientations on the support stand, allowing convenient watching of the images displayed on and projected from the electronic equipment, and further, the bottom base of the support stand can be retained on and fixed to the adaptor board, with the adaptor board being mountable to a wall by using screws, so that the support stand and the electronic equipment can be securely fixed on the wall without detachment and falling, providing the support stand with functions of supporting and elevating and lowering the electronic equipment and also achieving an effect of orientation changeability and securely mounting to a wall.

DETAILED DESCRIPTION OF THE PREFERRED EMBODIMENT

Figure 1:
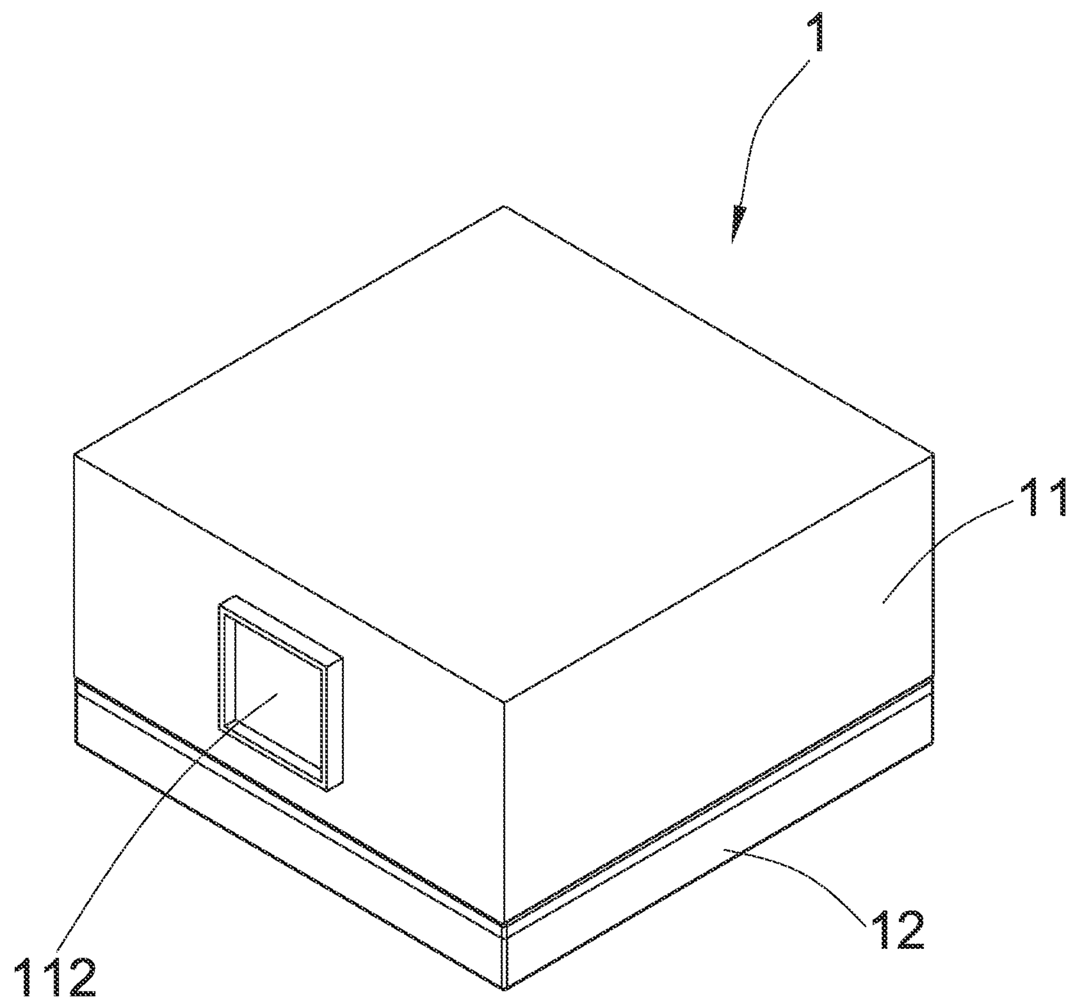
FIG. 1 is a perspective view, taken from a front side, showing a securely mountable/dismountable electronic equipment support stand according to the present invention.
Figure 2:
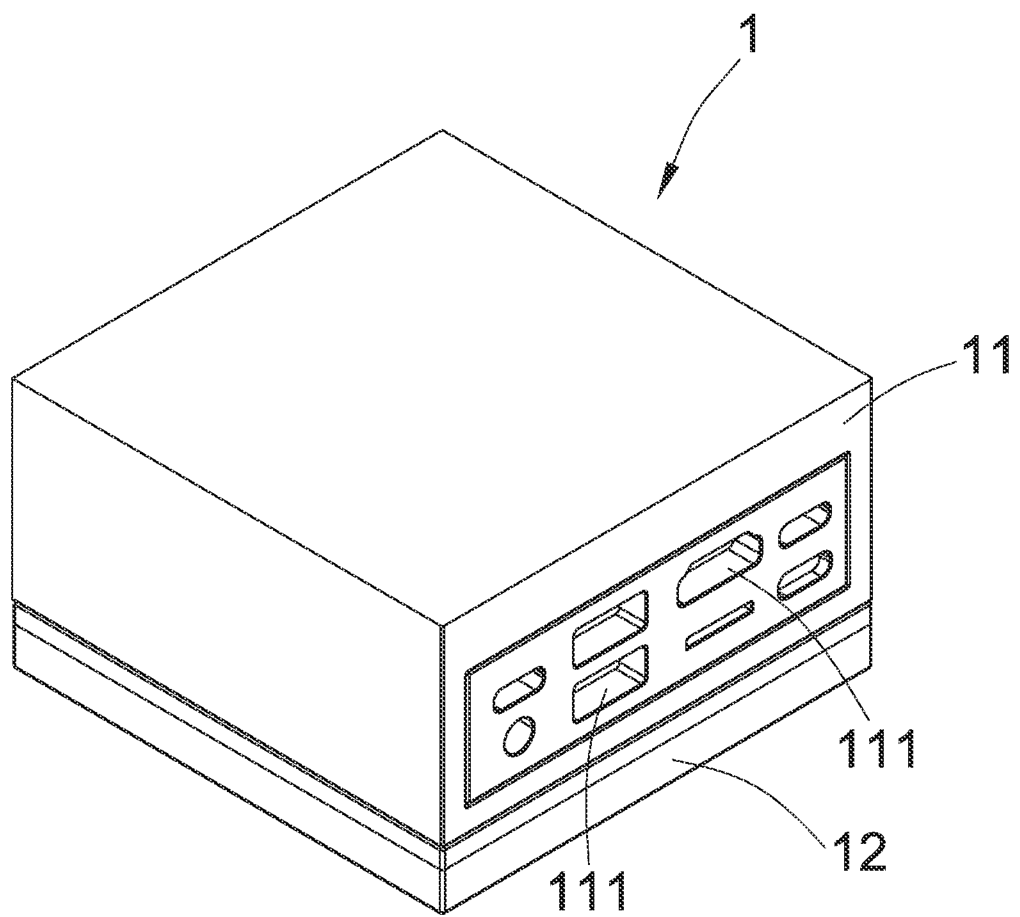
FIG. 2 is a perspective view, taken from a rear side, showing the securely mountable/dismountable electronic equipment support stand according to the present invention.

Referring to FIGS. 1 and 2, the present invention provides a securely mountable/dismountable electronic equipment support stand 1, which comprises: electronic equipment 11 and a support stand 12.

Figure 3:
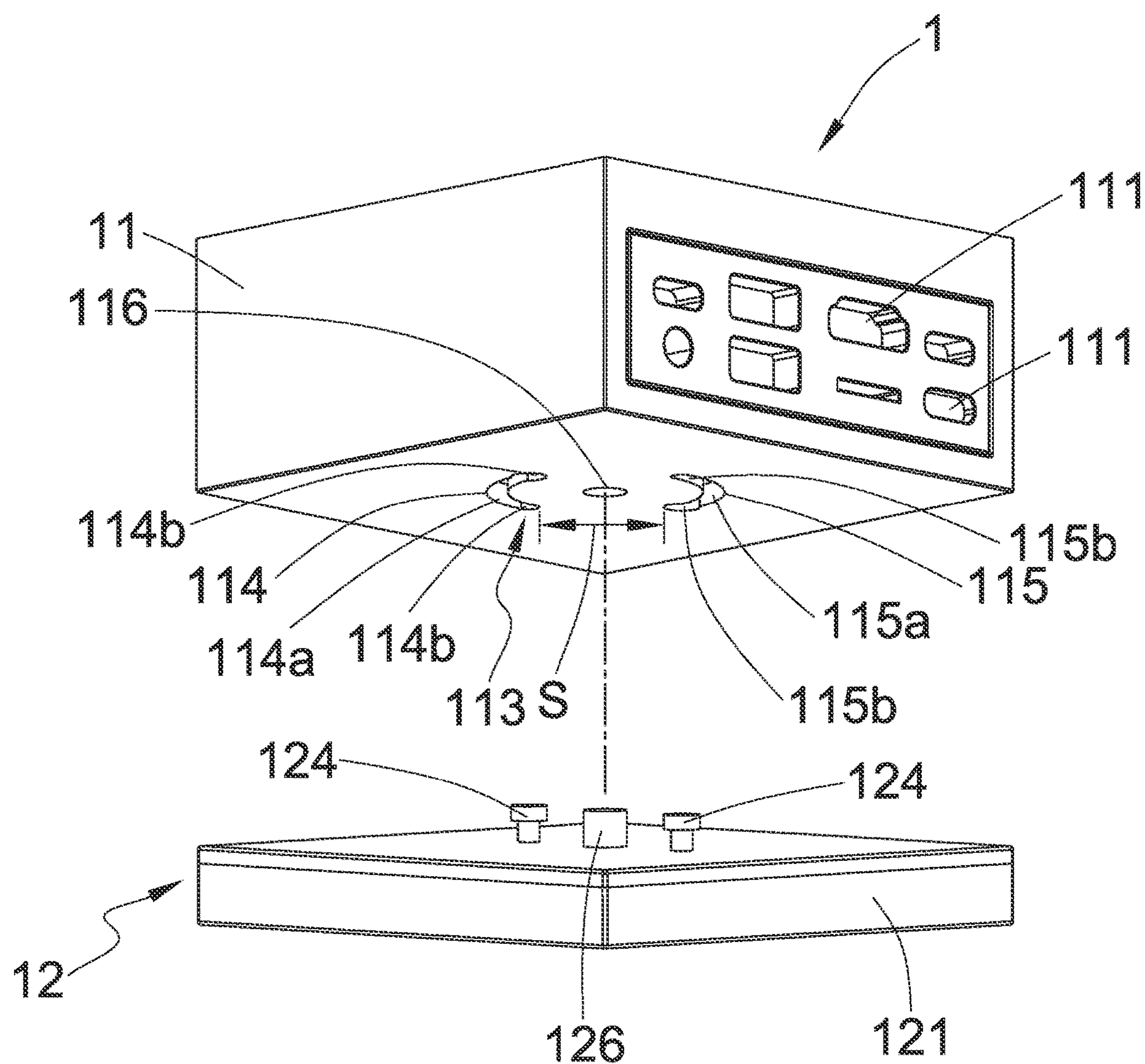
FIG. 3 is a perspective view illustrating electronic equipment detached from the support stand.

The electronic equipment 11 may comprise a mobile phone, a tablet computer, a microcomputer, a micro television set, or a projector. The electronic equipment 11 may comprise at least one connection port 111, a processor (not shown), and a screen 112 (or a lens). The at least one connection port 111 may comprise a universal serial bus (USB) connection port, a high definition multimedia interface (HDMI) connection port, and/or a USB-C connection port. The electronic equipment 11 receives, by means of the at least one connection port, an audio-video file; the processor processes the audio-video file; and the screen 112 (or the lens) plays or projects images of the audio-video file. However, details concerning the structure and operation of the electronic equipment 11 are publicly known in this field and are not novel part of the present invention, so that such details will be omitted therein. As shown in FIG. 3, the electronic equipment 11 is provided with a first arc groove 113. Generally, the first arc groove 113 is formed in a bottom or undersurface of the electronic equipment 11. The first arc groove 113 comprises a first groove segment 114 and a second groove segment 115, and at least one spacing distance S is formed between the first groove segment 114 and the second groove segment 115. Further, the first groove segment 114 and the second groove segment 115 of the first arc groove 113 are each divided into a sliding zone 114*a*, 115*a* and a retaining zone 114*b*, 115*b*. The sliding zone 114*a*, 115*a* has an inside diameter that is greater than an inside diameter of the retaining zone 114*b*, 115*b*. The electronic equipment 11 is further provided with a first axle hole 116.

Figure 4:
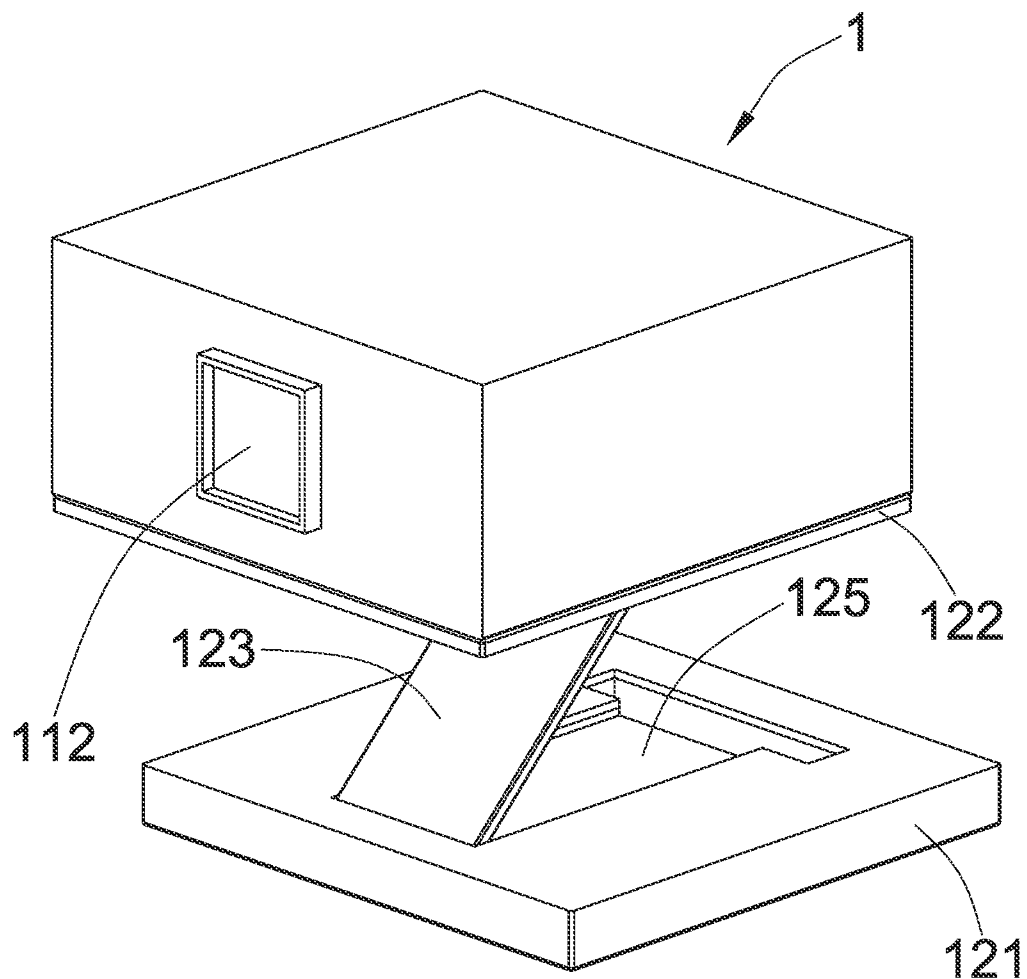
FIG. 4 is a perspective view illustrating electronic equipment mounted to the support stand.

Referring to FIGS. 3 and 4, the support stand 12 comprises a bottom base 121, a top base 122, and a supporting portion 123. The top base 122 is provided with two first pegs 124 corresponding to the first arc groove 113. The bottom base 121 is formed with a receiving space 125 corresponding to the supporting portion 123. The receiving space 125 is large enough to receive and accommodate the supporting portion 123 therein, such that the supporting portion 123 is receivable and stowed in the receiving space 125. The supporting portion 123 has two ends that are pivotally connected to and thus disposed between the bottom base 121 and the top base 122, such that the supporting portion 123 may elevate upward the top base 122 (as shown in FIG. 4) or lower down the top base 122. The top base 122 of support stand 12 is further provided with a first rotary axle 126 corresponding to the first axle hole 116.

Figure 5:
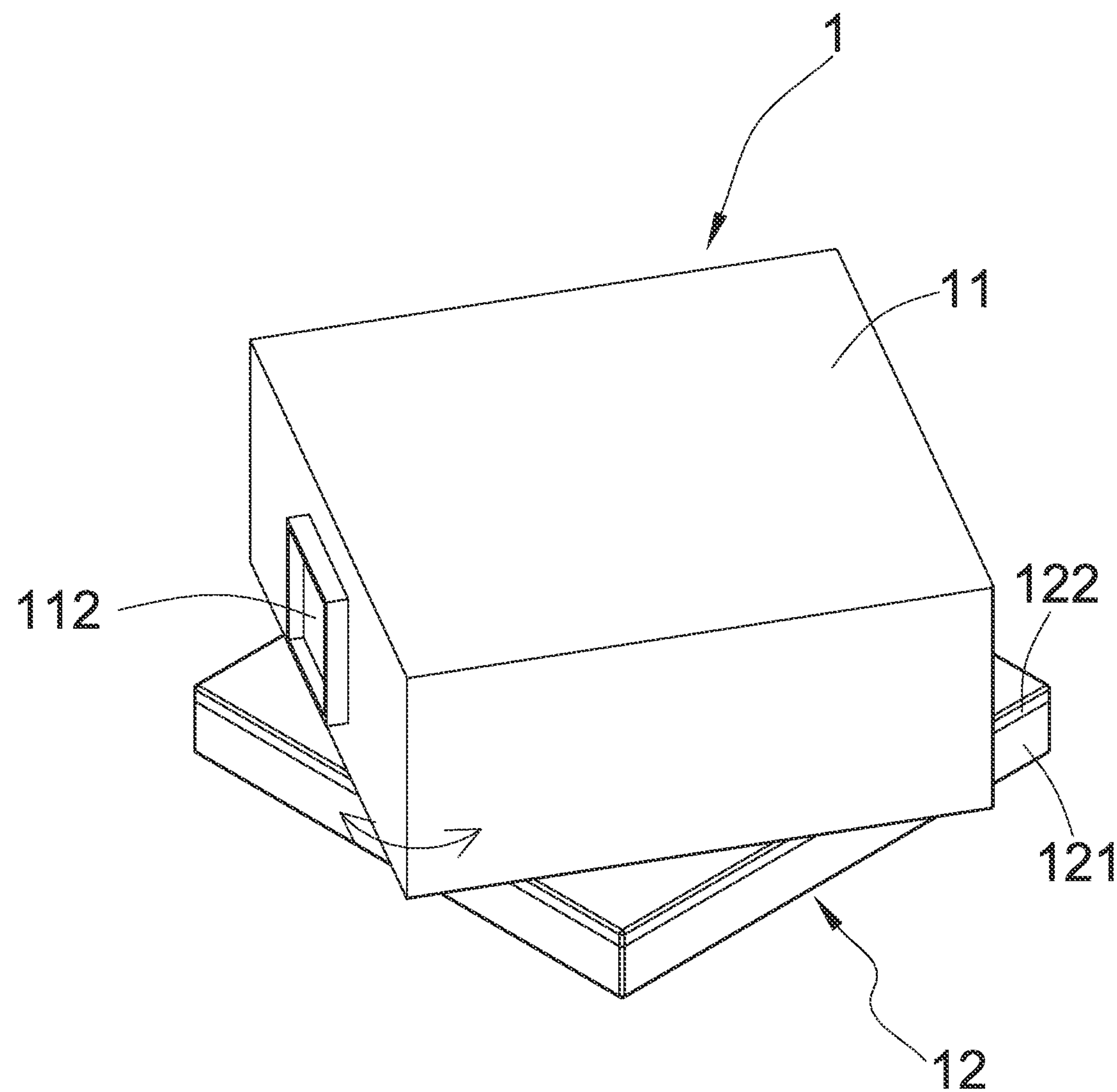
FIG. 5 is a perspective view illustrating rotation of electronic equipment on the support stand.

Referring to FIGS. 3 and 5, to use the securely mountable/dismountable electronic equipment support stand 1, the first groove segment 114 and the second groove segment 115 of the first arc groove 113 are set in collaborative engagement with the two first pegs 124, so that the electronic equipment 11 may be retained on and fixed to the top base 122 of the support stand 12. The first pegs 124 are respectively slidable in the sliding zones 114*a*, 115*a* and are retainable and fixable in the retaining zones 114*b*, 115*b* to prevent undesired or unexpected change of direction due to minor external impact. As such, the electronic equipment 11 is selectively rotatable to achieve angular adjustment and orientability of the electronic equipment 11 on the top base 122 of the support stand 12, making it convenient for watching the images played on and projected from the electronic equipment 11. Further, the first rotary axle 126 is collaboratively combinable with the first axle hole 116 in such a way that the first rotary axle 126 has a size that is substantially identical to a size of the first axle hole 116, enabling relative rotation and preventing undesired or unexpected detachment of the electronic equipment 11 during the rotation.

Figure 6:
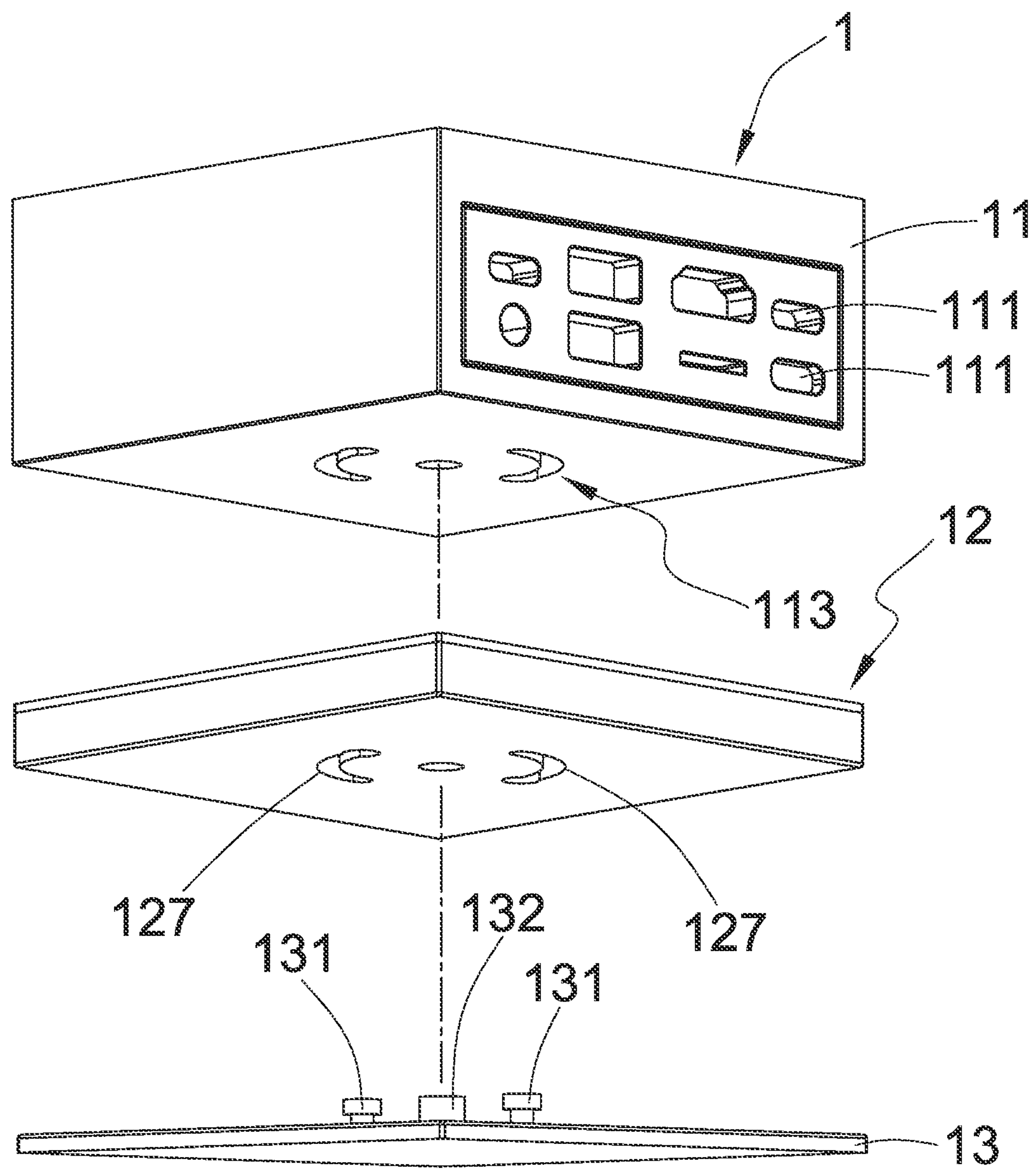
FIG. 6 is a perspective view illustrating electronic equipment, the support stand, and an adaptor board in a detached condition.
Figure 7:
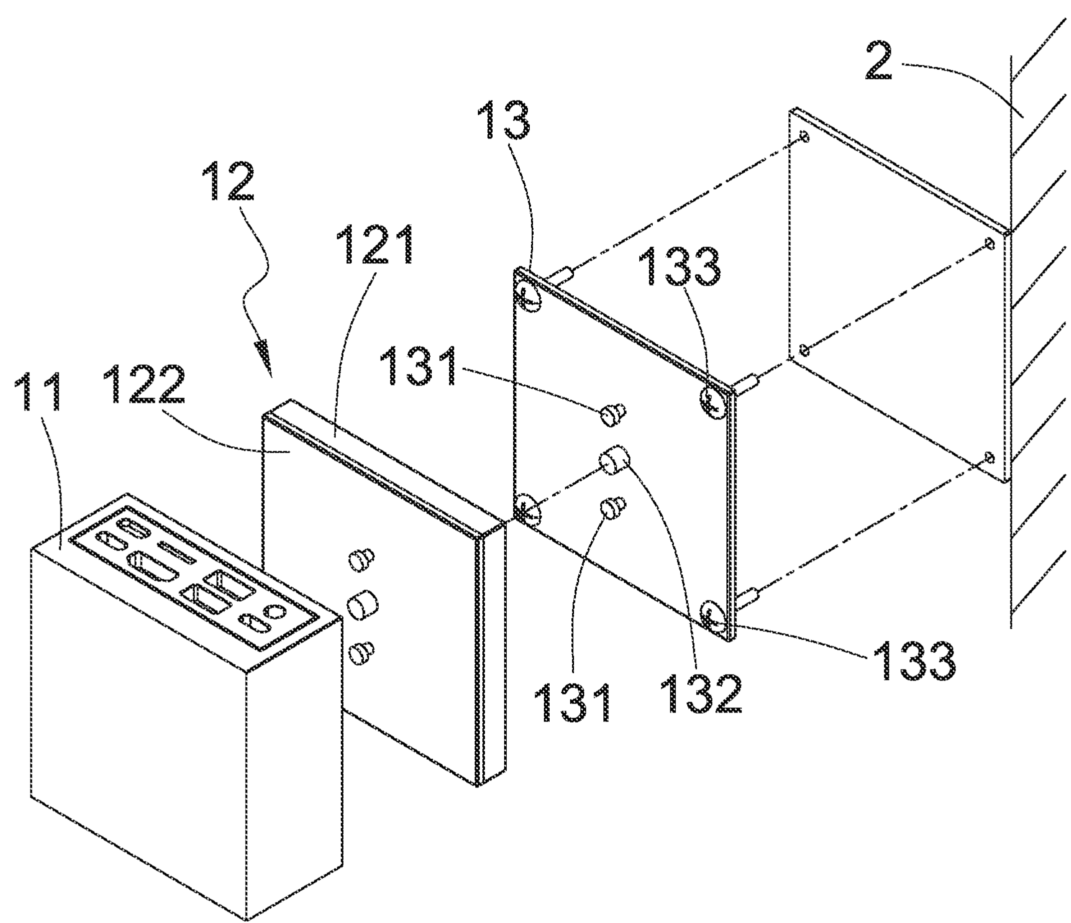
FIG. 7 is a perspective view, in an exploded form, illustrating the electronic equipment and the support stand mounted to a wall by means of the adaptor board.

Further referring to FIGS. 3 and 6, the bottom base of the support stand 12 is provided with a second arc groove 127. Further, an adaptor board 13 is arranged at one side of the support stand 12. The adaptor board 13 is provided with two second pegs 131 corresponding to the second arc groove 127. The bottom base of the support stand 12 is further provided with a second axle hole 128, and the adaptor board 13 is provided with a second rotary axle 132 corresponding to the second axle hole 128. Functions of the second arc groove 127, the second pegs 131, the second axle hole 128, and the second rotary axle 132 are respectively corresponding to those of the first arc groove 113, the first pegs 124, the first axle hole 116, and the first rotary axle 126, so that repeated description will be omitted herein. Referring to FIG. 7, the adaptor board 13 is provided with a plurality of fastening elements 133, and commonly, the fastening elements are screws. As such, the bottom base 121 of the support stand 12 can be fixed to the adaptor board 13, and the plurality of fastening elements 133 (screws) fix the adaptor board 13 to a wall 2.

In summary, the securely mountable/dismountable electronic equipment support stand 1 according to the present invention makes use of the collaborative combination between the first arc groove 113 and the two first pegs 124 to securely retain and fix the electronic equipment 11 to the top base 122 of the support stand 12, but still allowing the electronic equipment 11 to rotate so that the electronic equipment 11 demonstrates a capability of adjustment for various orientations on the support stand 12, allowing convenient watching of the images displayed on and projected from the electronic equipment 11, and further the bottom base 121 of the support stand 12 can be retained on and fixed to the adaptor board 13, with the adaptor board 13 being mountable to a wall 2 by using a plurality of fastening elements 133 (screws), so that the support stand 12 and the electronic equipment 11 can be securely fixed on the wall 2 without detachment and falling, providing the support stand 12 with functions of supporting and elevating and lowering the electronic equipment 11 and also achieving an effect of orientation changeability and securely mounting to a wall 2.

I claim:

1. A securely mountable/dismountable electronic equipment support stand, comprising:

electronic equipment, which is provided with a first arc groove; and a support stand, which comprises a bottom base, a top base, and a supporting portion, the top base being provided with two first pegs corresponding to the first arc groove, the bottom base being formed with a receiving space corresponding to the supporting portion, the supporting portion having two ends respectively pivoted to and arranged between the bottom base and the top base;

wherein the arc groove comprises a sliding zone and a retaining zone, the sliding zone having an inside diameter greater than an inside diameter of the retaining zone.

2. The securely mountable/dismountable electronic equipment support stand according to claim 1, wherein the first arc groove comprises a first groove segment and a second groove segment, the first groove segment and the second groove segment being provided therebetween with a spacing distance.

3. The securely mountable/dismountable electronic equipment support stand according to claim 1, wherein the bottom base of the support stand is formed with a second arc groove.

4. The securely mountable/dismountable electronic equipment support stand according to claim 1, wherein an adaptor board is disposed at one side of the support stand, the adaptor board being provided with two second pegs.

* * * * *